United States Patent
Fukada et al.

[11] Patent Number: 6,107,687
[45] Date of Patent: Aug. 22, 2000

[54] SEMICONDUCTOR DEVICE HAVING INTERCONNECTION AND ADHESION LAYERS

[75] Inventors: Tetsuo Fukada; Takeshi Mori; Makiko Hasegawa; Yoshihiko Toyoda, all of Hyogo, Japan

[73] Assignee: Mitsubishi Denki Kabushiki Kaisha, Tokyo, Japan

[21] Appl. No.: 09/039,388

[22] Filed: Mar. 16, 1998

[30] Foreign Application Priority Data

Mar. 18, 1997 [JP] Japan ................................. 9-064108

[51] Int. Cl.[7] .......................... H01L 23/48; H01L 23/52; H01L 29/40
[52] U.S. Cl. .......................... 257/762; 257/763; 257/751; 257/753
[58] Field of Search ..................... 257/762, 763, 257/764, 765, 753, 751, 758, 750; 438/687, 688, 637, 675

[56] References Cited

U.S. PATENT DOCUMENTS

| | | | |
|---|---|---|---|
| 4,961,822 | 10/1990 | Liao et al. | 257/753 |
| 5,470,792 | 11/1995 | Yamada | 438/625 |
| 5,592,024 | 1/1997 | Aoyama | 257/752 |
| 5,700,737 | 12/1997 | Yu et al. | 438/636 |
| 5,717,250 | 2/1998 | Schuele et al. | 257/754 |

FOREIGN PATENT DOCUMENTS

| | | | |
|---|---|---|---|
| 60-130165 | 7/1985 | Japan | 257/763 |
| 61-100952 | 5/1986 | Japan | 257/763 |
| 62-145774 | 6/1987 | Japan | 257/764 |

OTHER PUBLICATIONS

"Metal Capped Cu Interconnection Technology . . . ", T. Mori, et al., 1996 VLSI Multilevel Interconnection Conference, Santa Clara, California.

"Interconnection Process Employing Damascene Method" H. Shibata, Semiconductor World (monthly issued), Dec. 1995, pp. 179–184.

"Damascene Cu Interconnection Capped by TiWN Layer", T. Fukada, Shingakugiho Technical Report of IEICE. SDM96–169, Dec. 1996, pp. 85–92.

*Primary Examiner*—Olik Chaudhuri
*Assistant Examiner*—Phat X. Cao
*Attorney, Agent, or Firm*—McDermott, Will & Emery

[57] ABSTRACT

A Cu interconnection layer is formed in a trench provided in an insulating layer with a base layer interposed therebetween, an adhesion layer is formed on the Cu interconnection layer and a cap layer is formed on the adhesion layer to restrict exfoliation of the cap layer formed on the Cu interconnection layer buried in the trench formed in the insulating layer.

1 Claim, 9 Drawing Sheets

SEMICONDUCTOR DEVICE HAVING INTERCONNECTION AND ADHESION LAYERS

BACKGROUND OF THE INVENTION

1. Field of the Invention

The present invention relates to a semiconductor device, and in particular to a semiconductor device which has an interconnection layer formed of a material containing Cu and Cu alloy and buried in a trench formed in an insulation layer.

2. Description of the Background Art

Recently, various considerations have also been taken for interconnection materials in response to the increasing demand for the high integration and rapid operation of semiconductor devices. In particular, the materials available for interconnection are believed to be extremely limited for generations after that with an interconnection width of approximately 0.15 μm. Among such materials, it has recently been suggested that Cu is used as a material for interconnection.

FIG. 14 shows one example of the interconnection structure with Cu used as an interconnection material. The interconnection structure shown in FIG. 14 is formed by an interconnection process employing the so-called "Damascene method", which is described in, for example, "Interconnection Process Employing Damascene Method" published in monthly magazine *Semiconductor World*, December, 1995.

As shown in FIG. 14, a trench 2 is formed in an insulating layer 1 and a Cu interconnection layer 4 is formed in trench 2 with a base layer interposed therebetween. A cap layer 6 is formed to cover an upper surface of Cu interconnection layer 4. Cap layer 6 is formed of e.g. TiWN and acts to restrict oxidation of the upper surface of Cu interconnection layer 4. The provision of such a cap layer 6 can effectively restrict oxidation of the upper surface of Cu interconnection layer 4 and hence degradation in characteristics of Cu interconnection layer 4, such as increase in resistance of Cu interconnection layer 4.

The formation of such a cap layer 6 is described in, for example, "Damascene Cu interconnection capped by TiWN layer", Shingakugiho TECHNICAL REPORT OF IEICE. SDM96-169 (1996-12).

A method of fabricating the interconnection structure shown in FIG. 14 will now be described with reference to FIGS. 15–18 which are cross sections illustrating first to fourth steps of a process for fabricating the interconnection structure shown in FIG. 14, respectively.

Referring to FIG. 15, photolithography, etching and the like are employed to form trench 2 in insulating layer 1. Then, as shown in FIG. 16, chemical vapor deposition (CVD) or the like is employed to form a TiN layer 3a on which a Cu layer 4a is formed by sputtering or the like.

Then, chemical mechanical polishing (CMP) is applied to Cu layer 4a and TiN layer 3a to expose a surface of insulating layer 1 and also leave the Cu layer only in trench 2. Base layer 3 and Cu interconnection layer 4 are thus formed in trench 2, as shown in FIG. 17.

Sputtering or the like is then employed to form a TiWN layer 6a, as shown in FIG. 18. Then, the CMP is applied to TiWN layer 6a. The interconnection structure shown in FIG. 14 is obtained through this process.

While the formation of such a cap layer 6a can restrict oxidation of the upper surface of Cu interconnection layer 4, the Inventors of the present invention fabricated the interconnection structure shown in FIG. 14 as a trial and have found that exfoliation can be caused at the interface between cap layer 6 and Cu interconnection layer 4. One cause of the exfoliation is believed to be poor adhesion between Cu interconnection layer 4 and cap layer 6. The Inventors of the present invention have also found that the exfoliation is readily caused at the periphery of cap layer 6. Accordingly, it is believed that some stress is concentrated at the periphery of cap layer 6 and that stress concentration can be a cause of the exfoliation.

When such an exfoliation is caused at the interface between cap layer 6 and Cu interconnection layer 4, the upper surface of Cu interconnection layer 4 is oxidized and degradation in characteristic of Cu interconnection layer 4, such as increased resistance of Cu interconnection layer 4, is concerned. Such a degradation in characteristic of Cu interconnection layer 4 will lead to decreased yield and shortened lifetime of the interconnection.

SUMMARY OF THE INVENTION

The present invention has been made to solve the problem described above. An object of the present invention is to restrict exfoliation from a surface of Cu interconnection layer 4.

In one aspect, a semiconductor device according to the present invention includes an insulating layer, an interconnection layer, an adhesion layer and a cap layer. A trench is formed in the insulating layer and the interconnection layer is buried in the trench with a base layer interposed therebetween. The interconnection layer is formed of a material containing Cu. The adhesion layer is formed in the trench such that the adhesion layer covers the interconnection layer, and the cap layer is formed in the trench such that the cap layer covers the adhesion layer. The base layer acts so that it prevents diffusion of the material of the interconnection layer into the insulating layer, and also functions as an adhesion layer between the interconnection layer and the insulating layer. The adhesion layer has firm adhesion to both the interconnection layer and the cap layer and acts to connect the both layers firmly. The cap layer is resistant to oxidation and acts to restrict oxidation of the interconnection layer.

The adhesion layer preferably has better adhesion to the cap layer than the interconnection layer has to the cap layer, and is formed of a material in which the growth rate of oxide is lower than that of oxide in the interconnection layer.

It is also preferable that a reaction is caused between the adhesion layer and the interconnection layer to form a reaction layer between the cap layer and the interconnection layer.

If a reaction layer is formed as described above, the adhesion layers that are located on the interconnection layer may entirely be converted into reaction layers.

The semiconductor device in one aspect of the present invention described above has an adhesion layer formed on an interconnection layer and a cap layer formed on the adhesion layer. Since a material with good adhesion to the cap and interconnection layers is selected as the adhesion layer, the presence of the adhesion layer allows effective restriction of exfoliation of the cap layer. This can effectively restrict oxidation of the upper surface of the interconnection layer due to exfoliation of the cap layer, and hence occurrence of defective interconnection. Consequently, yield can be improved and the lifetime of interconnection can be prolonged, as compared with conventional semiconductor devices.

When the adhesion layer has better adhesion to the interconnection layer than the cap layer to the interconnection layer, and is formed of a material in which the growth rate of oxide is lower than that of oxide in the interconnection layer, exfoliation of the cap layer can be effectively restricted and the presence of such an adhesion layer can also restrict oxidation of the upper surface of the interconnection layer.

If a reaction is caused between the adhesion layer and the interconnection layer to form a reaction layer between the cap layer and the interconnection layer, the reaction layer is formed through the interdiffusion of a material of the interconnection layer and a material of the adhesion layer and exfoliation of the cap layer can thus be restricted more effectively than in the aforementioned example.

Furthermore, the adhesion layer may entirely be converted into the reaction layer. In this example also, exfoliation of the cap layer can be effectively restricted as well as the example with a reaction layer formed between the adhesion layer and the interconnection layer.

A semiconductor device in another aspect of the present invention includes an insulating layer, an interconnection layer and a cap layer. A trench is formed in the insulating layer and the interconnection layer is buried in the trench with a base layer interposed therebetween. The interconnection layer is formed of a material containing Cu. The cap layer is formed in the trench such that the cap layer covers the interconnection layer. Then, a rounding process is applied to an upper corner of a sidewall of the trench. If the insulating layer is formed of silicon oxide film, for example, a hydrofluoric acid-based etchant is used to apply light etching to the insulating layer after the formation of the trench. Application of such a processing allows an upper corner of a sidewall of the trench to be rounded and the peripheral portion of the cap layer thus extends on the rounded upper corner of the sidewall of the trench.

It should be noted that the upper corner of the sidewall of the trench is preferably formed of a curved surface of 2 to 20 nm in radius of curvature. Curved surfaces with different radii of curvature ranging from 2 to 20 nm may be contiguous with one another to form the upper corner of the sidewall of the trench.

Since the semiconductor device in another aspect of the present invention has a cap layer extending on a rounded corner located at an upper end of a sidewall of the trench formed in an insulating layer, the contact area between a peripheral portion of the cap layer and the insulating layer can be larger than conventional. Thus, the stress concentration at the peripheral portion of the cap layer, which has been conventionally concerned about, can be relaxed, and exfoliation of the cap layer can be restricted, as compared with conventional examples.

It should be noted that the corner located at the upper end of the sidewall of the trench is preferably formed of a curved surface of approximately 2 to 20 nm in radius of curvature. With such a range of radius of curvature, it can be readily implemented and does effectively avoid hindering microfabrication of semiconductor devices.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described with reference to FIGS. 1–11.

First Embodiment

Figure 1:
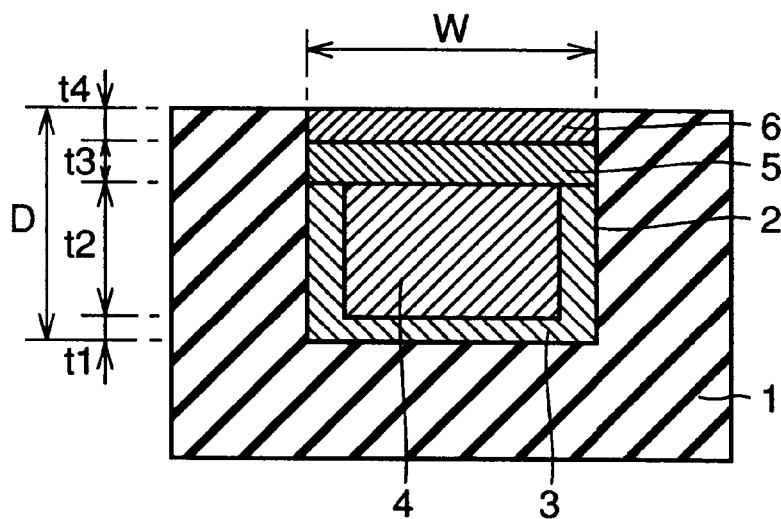
FIG. 1 is a cross section of an interconnection structure of a semiconductor device according to a first embodiment of the present invention.

A first embodiment of the present invention will now be descried with reference to FIGS. 1–7. FIG. 1 is a cross section of an interconnection structure according to the first embodiment of the present invention.

Referring to FIG. 1, an insulating layer 1 formed of e.g. silicon oxide film has a trench 2 which has an opening width W of e.g. approximately 0.18 $\mu$m and a depth D of approximately 0.3 $\mu$m. Trench 2 may have an aspect ratio of approximately 1 to 1.5.

Formed in trench 2 is a base layer 3 which is formed of e.g. TiN and has a thickness t1 of e.g. approximately 10 nm. Formed on base layer 3 is a Cu interconnection layer 4 which has a thickness t2 of e.g. approximately 200 nm. It should be noted that Cu—Zr, Cu—Ti, Cu—Al or the like can be used in place of Cu interconnection layer 4.

Cu interconnection layer 4 and base layer 3 is covered with an adhesion layer 5. Adhesion layer 5 is formed to enhance the adhesion between a cap layer 6 formed on adhesion layer 5 and Cu interconnection layer 4 and it is preferable that adhesion layer 5 has better adhesion to Cu interconnection layer 4 than Cu interconnection layer 4 to cap layer 6 and is formed of a material in which the growth rate of oxide is lower than that of oxide in Cu interconnection layer 4. The adhesion between Cu interconnection layer 4 and cap layer 6 can thus be enhanced, as compared with conventional examples, and oxidation of the upper surface of Cu interconnection layer 4 can be effectively restricted.

The materials of adhesion layer 5 may be Ti, TiN, Cr, Al, AlCu, AlSiCu and the like. Adhesion layer 5 preferably has a thickness t3 of approximately 3 to 50 nm to expect the aforementioned effect.

Cap layer 6 for this example is formed of TiWN. As shown in FIG. 1, cap layer 6 is buried in trench 2 such that cap layer 6 covers adhesion layer 5. Cap layer 6 has a thickness t4 of e.g. approximately 30 to 77 nm to be able to ensure that cap layer 6 is resistant to oxidation.

The formation of adhesion layer 5 is believed to allow exfoliation of cap layer 6 to be effectively restricted. In order to verify this, the Inventors of the present invention estimated whether exfoliation of cap layer 6 is caused when adhesion layer 5 is formed. Table 1 shows the estimation results. It should be noted that Table 1 is given with respect to an example with a Ti layer formed as adhesion layer 5.

TABLE 1

| Structure | Stress on TiWN layer in CMP | |
|---|---|---|
| | Increased Stress (Higher Polishing Rate: App. 400 nm/min.) | Reduced Stress (Lower Polishing Rate: App. 100 nm/min.) |
| TiN/Cu/TiWN | Exfoliation found at edge of interconnection | Partial exploration found at edge of interconnection |
| TiN/Cu/Ti/TiWN | No exfoliation found | No exfoliation found |
| TiN/Cu/Ti/TiWN (Heat treatment Provided) | No exfoliation found | No exfoliation found |

It can be seen from Table 1 that when a Ti layer is formed as adhesion layer 5, exfoliation of the cap layer (TiWN layer) is not caused regardless of the magnitude of the stress exerted on the cap layer after CMP. Thus, the formation of adhesion layer 5 is believed to allow exfoliation of cap layer 6 to be restricted effectively. It is also surmised that a similar effect can be achieved when the aforementioned materials other than a Ti layer are used as adhesion layer 5. Table 1 also refers to an adhesion layer 5 to which heat treatment is provided after its formation, which will be described later.

FIGS. 2–6 are cross sectional views illustrating first to fifth steps of a method of fabricating the interconnection structure shown in FIG. 1.

Figure 2:
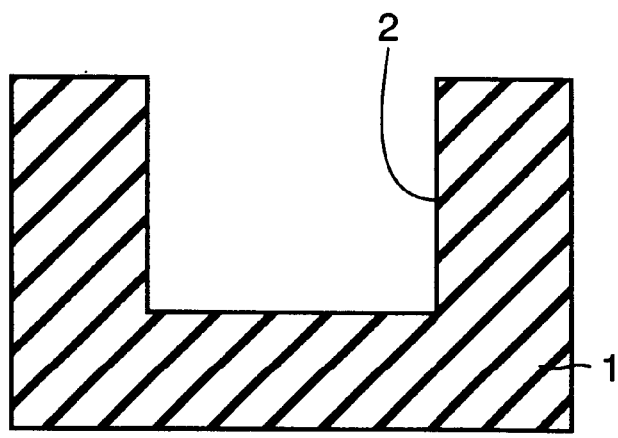
FIGS. 2–6 are cross sectional views illustrating first to fifth steps of a process for fabricating the interconnection structure shown in FIG. 1.
Figure 3:
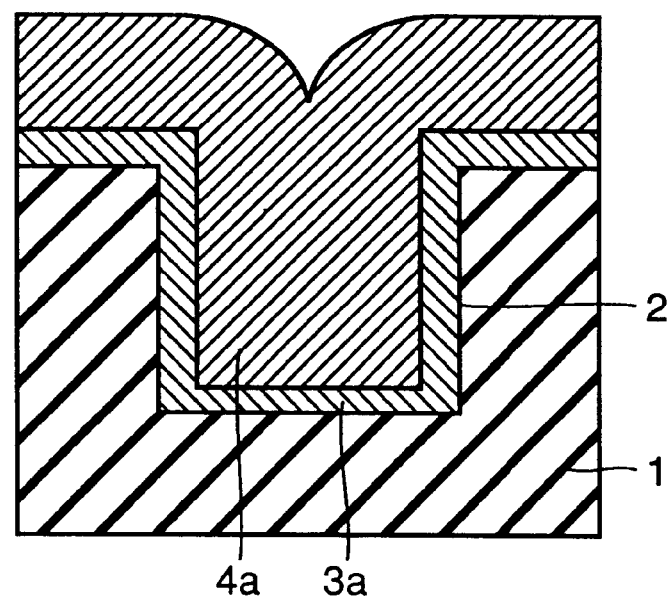

Referring to FIG. 2, trench 2 is formed by e.g. photolithography and dry etching. The dimensions of trench 2 is as described above.

Chemical vapor deposition or the like is then employed to form a TiN layer 3a of approximately 10 nm in thickness such that it extends from within trench 2 onto insulating layer 1. Chemical vapor deposition or sputtering is employed to form a Cu layer 4a of approximately 400 nm in thickness on TiN layer 3a.

Figure 4:
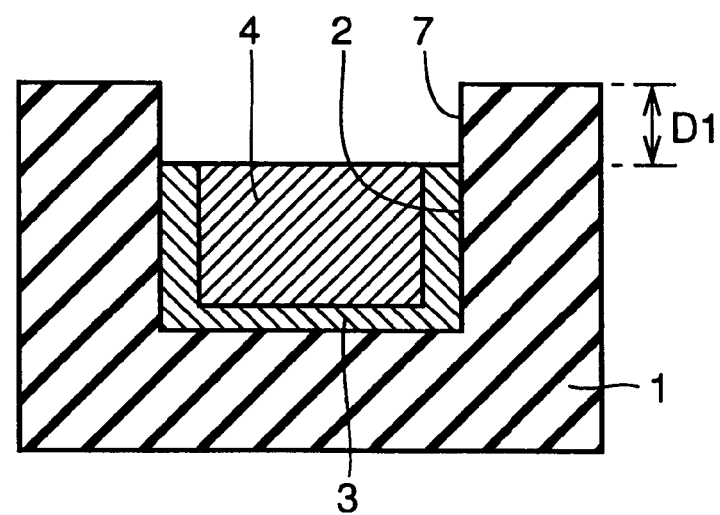

Then, chemical mechanical polishing is applied to Cu layer 4a and TiN layer 3a. Alumina-based slurry or the like may be used in the chemical mechanical polishing. The chemical mechanical polishing is performed until a main surface of insulating layer 1 is exposed. Consequently, Cu interconnection layer 4 and base layer 3 as well as a recessed portion 7 thereon are formed, as shown in FIG. 4. A depth D1 of recessed portion 7 is selected to be the sum of the thickness of adhesion layer 5 and the thickness of cap layer 6 formed in the subsequent steps and is e.g. approximately 80 nm in this example. Depth D1 of recessed portion 7 is preferably set at a relatively small value, i.e. approximately 50 to 80 nm to restrict reduction in cross sectional area of interconnection layer 4 and hence to restrict increase in interconnection resistance of Cu interconnection layer 4.

Figure 5:
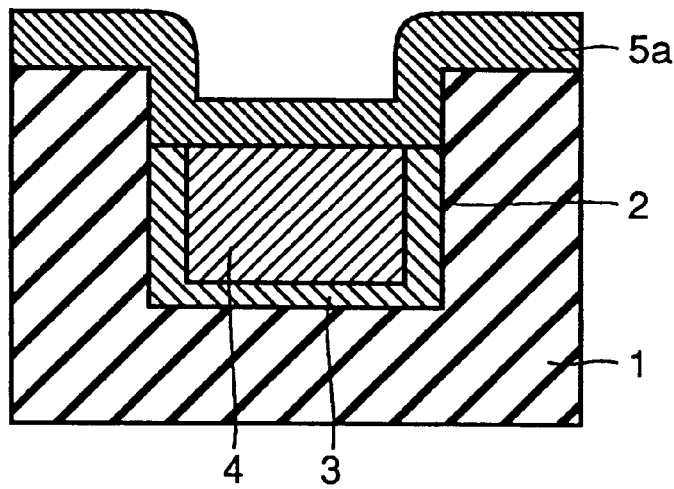

Then, sputtering or the like is employed to form a Ti layer 5a of approximately 200 nm in thickness, as shown in FIG. 5. Chemical mechanical polishing is then applied to Ti layer 5a.

Figure 6:
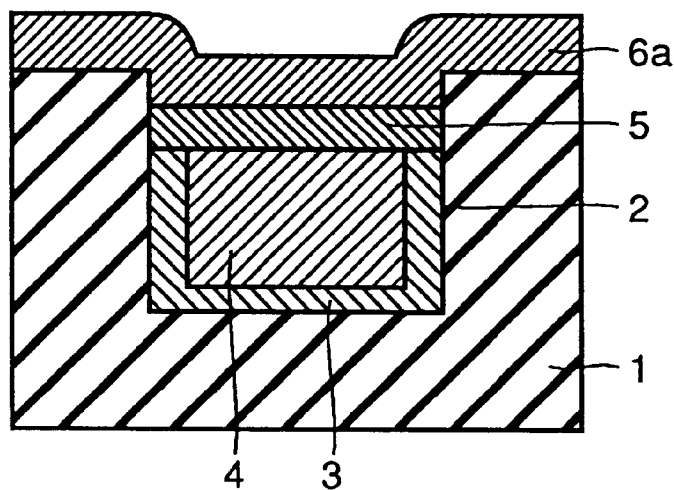

Thus, adhesion layer 5 can be formed such that it is buried in trench 2, as shown in FIG. 6. Then, sputtering or the like is further employed to form a TiWN layer 6a of approximately 200 nm in thickness. Chemical mechanical polishing is also applied to TiWN layer 6a. Alumina-based slurry may also be used in the chemical mechanical polishing. The interconnection structure shown in FIG. 1 is obtained through this process.

It should be noted that Ti layer 5a and TiWN layer 6a may be successively formed and chemical mechanical polishing may be applied to the stacked structure.

Figure 7:
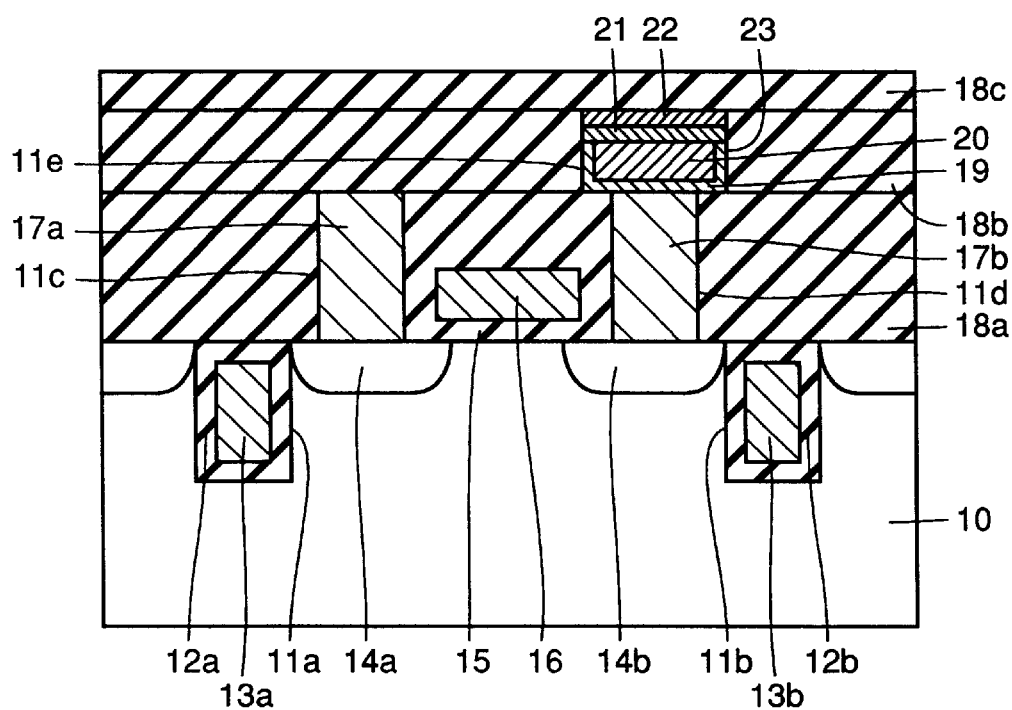
FIG. 7 is a partial cross section of a semiconductor device (DRAM) with application of the interconnection structure according to the first embodiment of the present invention.

An application of the interconnection structure according to the first embodiment will now be described with reference to FIG. 7 showing a cross section of one example of a semiconductor device with application of the interconnection structure according to the first embodiment. More specifically, FIG. 7 shows a portion of a dynamic random access memory (DRAM) with application of the interconnection structure according to the first embodiment.

Referring to FIG. 7, provided in a main surface of a silicon substrate 10 are impurity diffusion regions 14a and 14b which define a channel region. Trenches 11a and 11b are formed adjacent to impurity diffusion regions 14a and 14b and opposite to the channel. Polysilicon layers 13a and 13b are formed in trenches 11a and 11b with insulating layers 12a and 12b interposed therebetween, respectively.

Formed on the channel region is a gate electrode 16 with a gate insulating layer 15 interposed therebetween. An interlayer insulating layer 18a formed of silicon oxide or the like is formed on a main surface of silicon substrate 10 to cover gate electrode 16. Contact holes 11c and 11d are formed in interlayer insulating layer 18a such that contact holes 11c and 11d reach impurity diffusion regions 14a and 14b. Formed in contact holes 11c and 11d are plug electrodes 17a and 17b formed of W or the like.

An interlayer insulating layer 18b is formed to cover interlayer insulating layer 18a. A trench 23 is formed in interlayer insulating layer 18b and a base layer 19 formed of TiN or the like is formed in trench 23. A Cu interconnection layer 20 is formed on base layer 19 and an adhesion layer 21 is formed on Cu interconnection layer 20. A cap layer 22 of TiWN is formed on adhesion layer 21. An interlayer insulating layer 8c is formed on interlayer insulating layer 18b to cover cap layer 22. It should be noted that a Cu interconnection layer may also be formed in interlayer insulating layer 18c, although the depiction and description thereof are omitted here.

Second Embodiment

Figure 8:
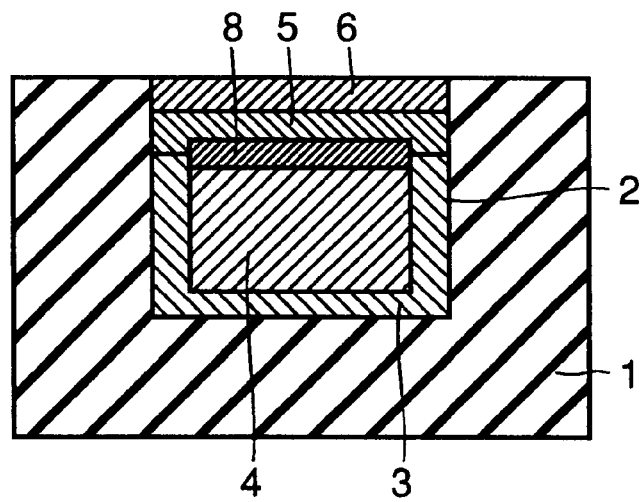
FIG. 8 is a cross section of an interconnection structure of a semiconductor device according to a second embodiment of the present invention.
Figure 9:
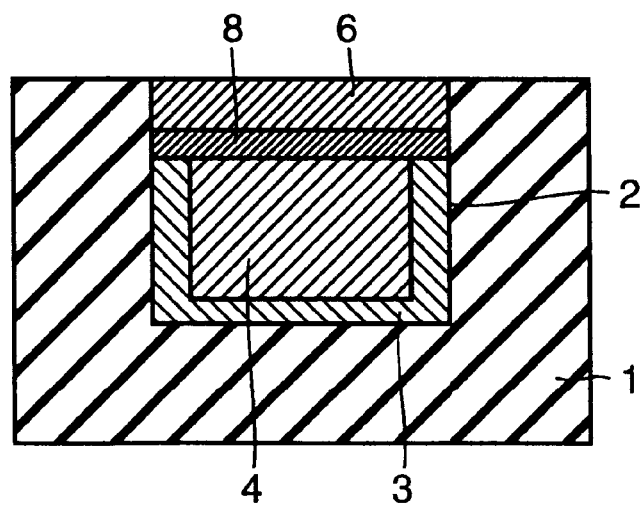
FIG. 9 is a cross section of a variation of the interconnection structure shown in FIG. 8.

A second embodiment of the present invention will now be described with reference to FIGS. 8 and 9. FIG. 8 is a cross section of an interconnection structure according to the second embodiment of the present invention. FIG. 9 is a cross section of a variation of the interconnection structure shown in FIG. 8.

Referring to FIG. 8, the second embodiment has a reaction layer 8 formed between an adhesion layer 5 and a Cu interconnection layer 4. Reaction layer 8 is a layer formed through interdiffusion of the elements forming Cu interconnection layer 4 and adhesion layer 5 and formation of such a reaction layer 8 can achieve better adhesion between adhesion layer 5 and Cu interconnection layer 4 than in the first embodiment. Accordingly, exfoliation of cap layer 6 can be more effectively restricted than in the first embodiment.

With adhesion layer 5 formed of e.g. Ti, reaction layer 8 can be formed by performing a heat treatment at approximately 200 to 400° C. for approximately 30 minutes in vacuum or an ambient of inert gas.

A variation of the interconnection structure shown in FIG. 8 will now be described with reference to FIG. 9. In the present variation shown in FIG. 9, adhesion layer 5 located on Cu interconnection layer 4 is entirely converted into reaction layer 8 by the aforementioned heat treatment performed after formation of adhesion layer 5. In this example also, exfoliation of cap layer 6 can be restricted more effectively than in the first embodiment, as well as the above example. It should be noted that since adhesion layer 5 located on Cu interconnection layer 4 is required to be entirely converted into reaction layer 8 in the present variation, appropriate conditions for the heat treatment are selected depending on the thickness of adhesion layer 5.

Third Embodiment

Figure 10:
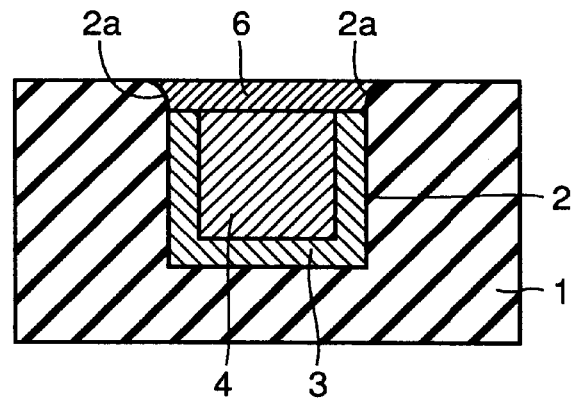
FIG. 10 is a cross section of an interconnection structure of a semiconductor device according to a third embodiment of the present invention.

A third embodiment of the present invention and a variation thereof will now be described with reference to FIGS. 10–13. FIG. 10 is a cross section of an interconnection structure according to the third embodiment of the present invention.

In the third embodiment shown in FIG. 10, a corner 2a located at an upper end of a sidewall of trench 2 is rounded and cap layer 6 is formed to extend on the rounded corner 2a located at the upper end of the sidewall of trench 2. As has been pointed out as a disadvantage of conventional examples, the observation result has been obtained that exfoliation is readily caused at a periphery of cap layer 6 and it is thus surmised that some stress concentration is readily caused at the periphery of cap layer 6.

In order to relax the stress concentration at the periphery of cap layer 6, the Inventors of the present invention rounded corner 2a located at the upper end of the sidewall of trench 2 and extended the periphery of cap layer 6 on the rounded corner 2a, as shown in FIG. 10. The contact area between the periphery of cap layer 6 and insulating layer 1 can thus be increased as compared with conventional examples and it is thus believed that the stress concentration can be relaxed. Accordingly, it is believed that exfoliation of cap layer 6 that has been conventionally concerned about can be restricted effectively.

Figure 11:
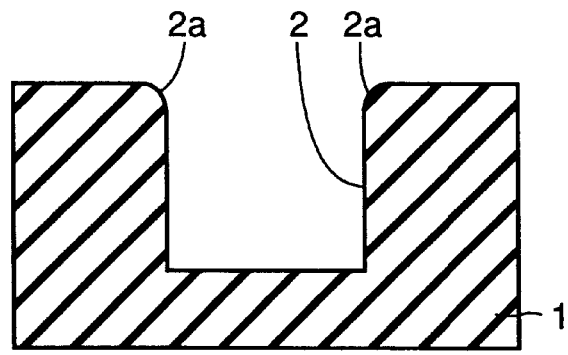
FIG. 11A is a cross sectional view illustrating a first step of a process for fabricating the interconnection structure shown in FIG. 10
FIG. 11B is an enlarged view of a corner located at an upper end of a sidewall of a trench shown in FIG. 11A.
Figure 11:
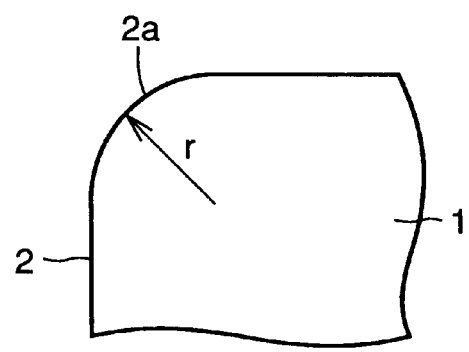
Figure 12:
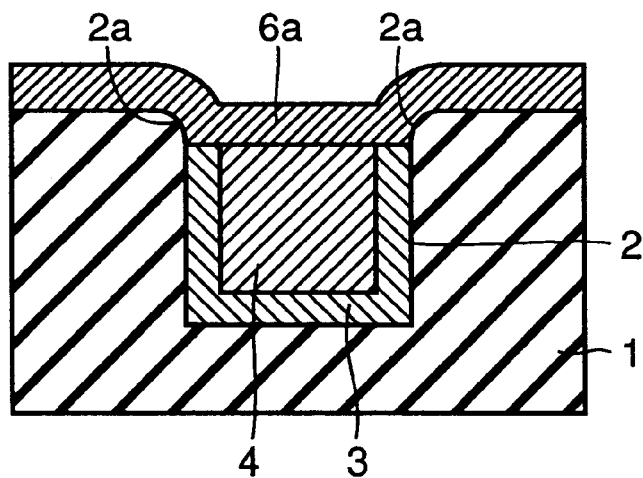
FIG. 12 is a cross sectional view illustrating a second step of the process for fabricating the interconnection structure shown in FIG. 10.

FIGS. 11 and 12 are cross sectional views illustrating first and second steps of a method of fabricating the interconnection structure according to the third embodiment.

Referring to FIG. 11A, trench 2 is formed via steps similar to those in the first embodiment and corner 2a located at an upper end of a sidewall of trench 2 is then rounded. For insulating layer 1 of silicon oxide film, for example, light etching is performed using a hydrofluoric acid-based etchant. Corner 2a located at the upper end of the sidewall of trench is thus rounded by edging effect.

FIG. 11B is an enlarged view of corner 2a located at an upper end of a sidewall of trench 2. Corner 2a located at an upper end of a sidewall is preferably formed of a curved surface with a predetermined radius r of curvature which is preferably approximately 2 to 20 nm, since a curved surface with a radius r of curvature less than 2 nm is extremely difficult to implement and radii r of curvature exceeding 20 nm increase the spacing between adjacent interconnections and thus hinder microfabrication. Thus, the curved surface can be implemented with a radius r of curvature ranging from 2 to 20 nm and is not believed to be so disadvantageous in microfabrication.

While FIG. 11B shows corner 2a formed of a curved surface with a constant radius r of curvature, corner 2a may be formed of curved surfaces having different radii r of curvature and contiguous with one another. The concept of the 'curved surface' described above includes a surface which is not constituted by a microscopic curved surface but can be recognized as a curved surface as a whole.

Referring now to FIG. 12, a method similar to that of the first embodiment is employed to form Cu interconnection layer 4 and base layer 3 on which TiWN layer 6a of approximately 200 nm in thickness is formed by sputtering or the like. Then, chemical mechanical polishing is applied to TiWN layer 6a, as in the first embodiment. Thus, cap layer 6 can be formed in trench 2 such that cap layer 6 extends on corner 2a located at an upper end of a sidewall of trench 2, as shown in FIG. 10.

Figure 13:
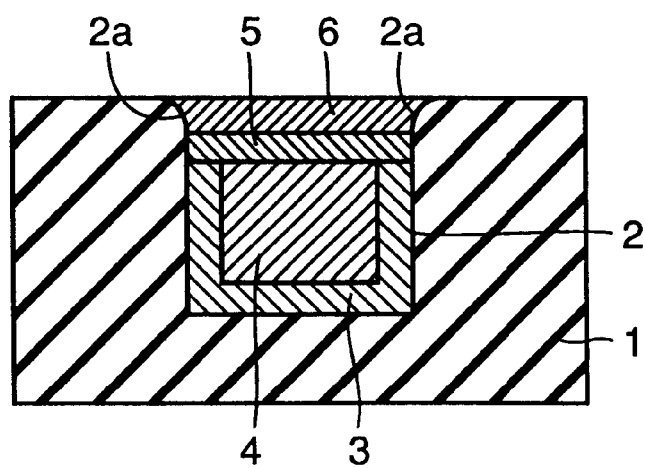
FIG. 13 is a cross section of a variation of the interconnection structure shown in FIG. 10.
Figure 14:
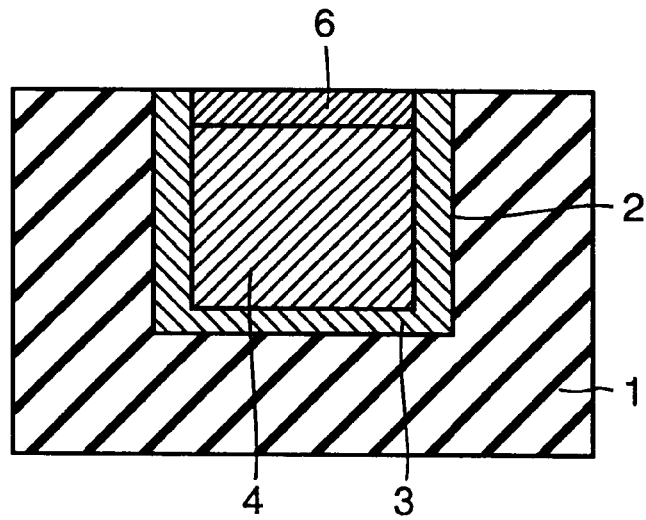
FIG. 14 is a cross section of one example of a conventional interconnection structure of a semiconductor device.
Figure 15:
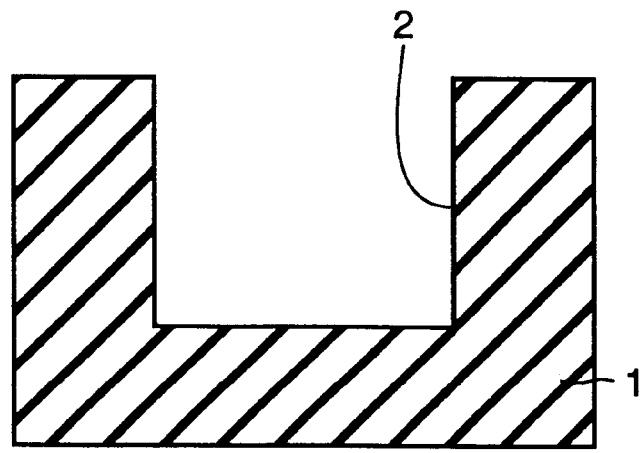
FIGS. 15–18 are cross sectional views illustrating first to fourth steps of a process for fabricating the interconnection structure shown in FIG. 14.
Figure 16:
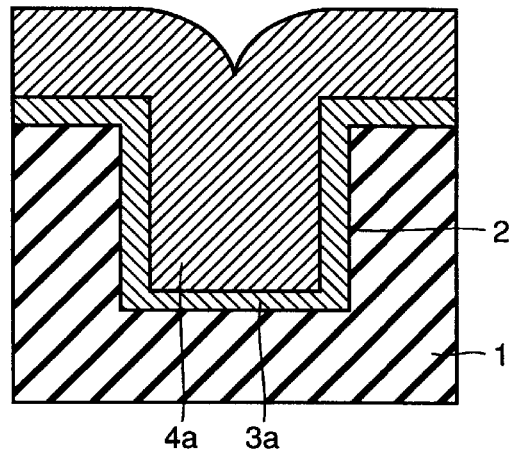
Figure 17:
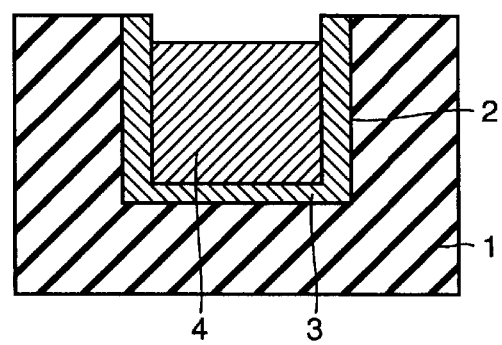
Figure 18:
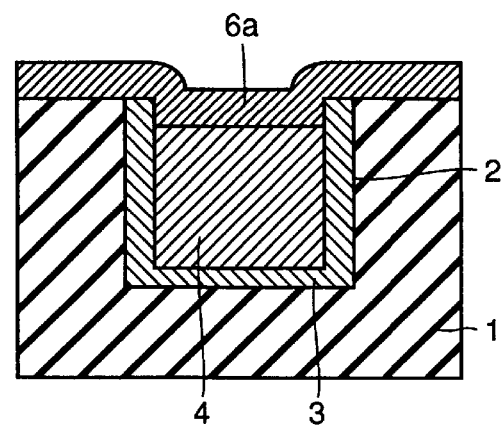

A variation of the third embodiment will now be described with reference to FIG. 13. As shown in FIG. 13, the present variation has adhesion layer 5 formed between cap layer 6 and Cu interconnection layer 4. Thus, it is believed that exfoliation of cap layer 6 can further be restricted as compared with the first embodiment. It should be noted that reaction layer 8 as described in the second embodiment may also be formed in the present variation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

an insulating layer having a trench formed therein;

an interconnection layer buried in said trench with a base layer interposed therebetween, and formed of a material containing Cu and Cu alloy;

an adhesion layer formed in said trench to cover said interconnection layer; and a cap layer formed in said trench to cover said adhesion layer, wherein a reaction layer is formed between said cap layer and said interconnection layer by causing a reaction between said adhesion layer and said interconnection layer, and wherein said adhesion layer located on said interconnection layer is entirely converted into said reaction layer.

* * * * *